United States Patent [19]
Smith

[11] Patent Number: 5,574,626
[45] Date of Patent: Nov. 12, 1996

[54] ADD-ON HEAT SINK

[75] Inventor: Grant M. Smith, Bryn Athyn, Pa.

[73] Assignee: Unisys Corporation, Blue Bell, Pa.

[21] Appl. No.: 501,479

[22] Filed: Jul. 12, 1995

[51] Int. Cl.$^6$ .............................. H05K 7/20; H01L 23/40
[52] U.S. Cl. ........................ 361/704; 165/80.3; 165/185; 361/710
[58] Field of Search ................... 165/803, 185; 174/16.3; 361/697, 704, 710; 257/722, 713

[56] References Cited

U.S. PATENT DOCUMENTS

| | | | |
|---|---|---|---|
| 3,572,428 | 3/1971 | Monaco | 165/80 |
| 3,670,215 | 6/1972 | Wilkens et al. | 317/234 R |
| 3,909,679 | 9/1975 | Petri | 317/100 |
| 4,190,098 | 2/1980 | Hanlon | 165/1 |
| 4,483,389 | 11/1984 | Balderes et al. | 165/80 B |
| 4,674,004 | 6/1987 | Smith et al. | 361/384 |
| 4,800,956 | 1/1989 | Hamburgen | 165/185 |
| 5,047,893 | 9/1991 | Farrall et al. | 361/704 X |
| 5,052,481 | 10/1991 | Horvath et al. | 165/185 |
| 5,161,087 | 11/1992 | Frankeny et al. | 361/382 |
| 5,406,451 | 4/1995 | Korinsky | 361/697 |

OTHER PUBLICATIONS

"Thermal Winged Heat Sink", Article 28858, *Research Disclosure* 1988, No. 288, Kenneth Mason Publications Ltd., England.

"Dendritic Heat Sink" V. D. Van Vestrout IBM Tech. Discl. Bulletin vol. 22 No. 2 Jul. 1979.

*Primary Examiner*—Allen J. Flanigan
*Attorney, Agent, or Firm*—John B. Sowell; Mark T. Starr; John F. O'Rourke

[57] ABSTRACT

An add-on heat sink for increasing the thermal efficiency of an existing heat sink comprises a support base, a first plurality of fins extending from the support base for dissipating heat and a second plurality of spaced fins extending from the support base that are arranged to intermesh with the fins of the existing heat sink and to form an interference fit therewith, whereby the add-on heat sink can be removably attached to the existing heat sink.

17 Claims, 2 Drawing Sheets

ADD-ON HEAT SINK

FIELD OF THE INVENTION

The present invention relates to heat sink apparatus for cooling electrical and electronic components, such as integrated circuits.

BACKGROUND

Conventional computer systems, including mainframes, mini-computers and desktop computers, use a variety of means for cooling the integrated circuits (IC's) that they contain. Desktop computers, for example, typically employ a small fan that blows air across the motherboard of the computer. Heat sinks are often affixed to the integrated circuits to facilitate heat dissipation.

Mainframe computers typically employ more sophisticated cooling systems. For example, U.S. Pat. No. 4,674,004, describes a system of parallel cooling for use in a mainframe computer wherein each circuit of the mainframe receives its own supply of ambient-temperature air. This type of forced-air cooling permits the use of very small heat sinks in relation to the amount of power that is being dissipated by the various circuits. Mainframe computers have also traditionally been housed in air-conditioned computer rooms that provide a well-controlled, cool air environment.

As computer systems continue to downsize, the cooling environments for circuit boards become more demanding. The trend is to move computer systems out of isolated computer rooms into open office areas. This causes two problems. First, the cooling air provided for the system is not as well-controlled and is usually hotter than that found in an air-conditioned computer room. Second, because of the noise associated with cooling fans, smaller fans are often used with correspondingly reduced airflow.

New systems must be designed to deal with these less friendly thermal conditions, and one solution has been to employ larger, more efficient heat sinks. Larger heat sinks with greater surface area and better conduction paths are able to cool the integrated circuits of a computer system, despite the harsher thermal conditions.

A problem arises, however, when the designer of a computer system intended for harsher environments wants to incorporate an existing circuit board that was originally designed for use in a more controlled computer room environment. The heat sinks provided on such circuit boards are often insufficient to adequately dissipate heat in the harsher environment of the new system. Accordingly, there is a need for an apparatus that allows the heat sink capabilities of an existing circuit board to be upgraded for use in newer, more demanding thermal environments, thus avoiding the need to redesign the entire circuit board. The present invention satisfies this need.

SUMMARY OF THE INVENTION

The present invention is directed to an add-on heat sink that can be readily attached and removed from an existing heat sink on an integrated circuit. The add-on heat sink of the present invention is particularly well suited for attachment to an existing heat sink of the type comprising a convoluted material soldered to the top of the integrated circuit that has a plurality of folds that form flexible fins for dissipating heat.

According to the present invention, the add-on heat sink comprises a support base having a first plurality of fins extending therefrom for dissipating heat, and a second plurality of spaced fins extending therefrom for attaching the add-on heat sink to an existing heat sink. Specifically, the second plurality of fins are sized and arranged to intermesh with the fins of the existing heat sink, and to form an interference fit in the spacings between the successive fins of the existing heat sink. In this manner, the add-on heat sink can be easily attached to an existing heat sink, but can also be readily removed during servicing. Intermeshing of the fins of the add-on heat sink with the fins of the existing heat sink provides an increased area of contact that improves the conduction of heat between the add-on and existing heat sinks. A good thermal interface is therefore achieved without the need for additional thermal interface material.

The add-on heat sink of the present invention provides a means for upgrading the heat dissipation capabilities of an existing heat sink. This allows circuit boards designed with such existing heat sinks to be upgraded for use in harsher thermal environments without the need for redesigning the circuit board. One circuit board design can therefore be used in several different thermal environments. This also allows customers to maintain a single source of spare circuit boards that can then be used in computers systems having different thermal characteristics.

Other features and advantages of the present invention will become evident hereinafter.

BRIEF DESCRIPTION OF THE DRAWINGS

The foregoing summary, as well as the following detailed description of the preferred embodiment, is better understood when read in conjunction with the appended drawings. For the purpose of illustrating the invention, there is shown in the drawings an embodiment that is presently preferred, it being understood, however, that the invention is not limited to the specific methods and instrumentalities disclosed. In the drawings.

DETAILED DESCRIPTION OF THE PREFERRED EMBODIMENT

Figure 1:
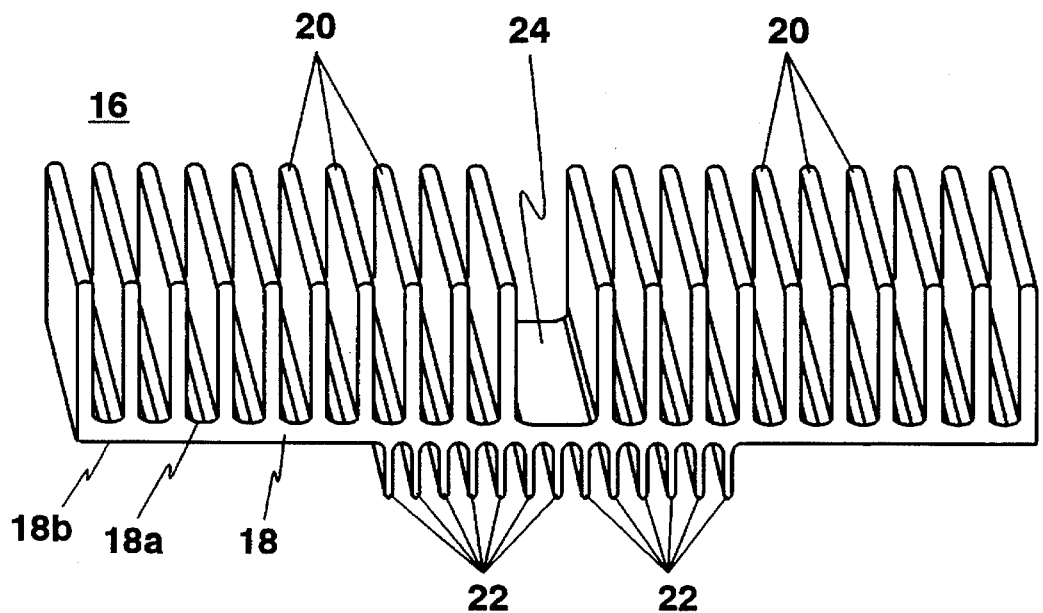
FIG. 1 is a perspective view of an add-on heat sink in accordance with a preferred embodiment of the present invention.

Referring to the drawings, wherein like numerals indicate like elements throughout, there is shown in FIG. 1 an add-on heat sink 16 in accordance with a preferred embodiment of the present invention. As described more fully below, the add-on heat sink 16 can be attached to an existing heat sink (FIG. 2) in order to increase the heat dissipating capabilities of the existing heat sink. As shown in FIG. 1, the add-on heat sink 16 of the present invention comprises a support base 18 which, in the preferred embodiment, is substantially planar. The add-on heat sink 16 of the present invention further comprises a first plurality of spaced fins 20 for dissipating heat. In the present embodiment, each of the first plurality of fins 20 extends upwardly from an upper surface 18a of the support member and forms a right angle with the substantially planar surface of the support member 18. However, the present invention is by no means limited thereto. For example, in other embodiments, the first plurality of fins 20 could extend downwardly from the lower surface of the support member 18. Also, the first plurality of fins 20 could extend at less than right angles to the planar surface of the support member 18. Still further, the first plurality of fins 20 can assume other shapes suitable for dissipating heat in a given environment. FIG. 1 simply illustrates a preferred embodiment.

Further according to the present invention, the add-on heat sink 16 of the present invention further comprises a second plurality of fins 22 extending from the support member. In the present embodiment, the second plurality of fins 22 extend downwardly from a lower surface 18b of the support member. As described more fully below, the second plurality of fins 22 are sized and arranged to intermesh with the fins of an existing heat sink when pushed down onto the existing heat sink, and to form an interference fit in the spacings between successive fins of the existing heat sink. In this manner, the add-on heat sink 16 can be removably attached to the existing heat sink.

In the present embodiment, the add-on heat sink 16 is formed of a heat conductive material, such as, for example, an aluminum alloy. Preferably, the support base 18 and first and second pluralities of fins 20, 22 are integrally formed as a single part by, for example, an extrusion process. A heat conductive material that is both easy to extrude and has good heat dissipating properties is 6063 T5 aluminum alloy.

Figure 2:
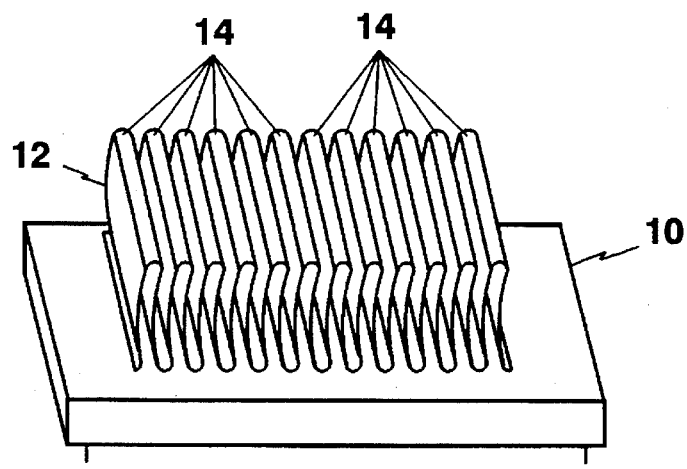
FIG. 2 is a perspective view of an exemplary integrated circuit chip with an existing heat sink mounted thereon for dissipating heat from the integrated circuit.

FIG. 2 shows an integrated circuit chip 10 having an existing heat sink 12 affixed thereto for dissipating heat from the integrated circuit chip 10. The existing heat sink 12 is of a type that comprises a laminated heat conductive material, such as a lamination of copper and Invar™, that is then corrugated such that the resulting folds form individual, spaced fins 14 for dissipating heat from the integrated circuit 10. Generally, the spacing between successive fins 14 of the existing heat sink 12 is substantially uniform, and the corrugated nature of the laminated material imparts a degree of flexibility to each fin 14. The add-on heat sink 16 of the present invention is particularly well-suited for use with this type of existing heat sink. However, the add-on heat sink 16 of the present invention is by no means limited to use with such existing heat sinks. Rather, the add-on heat sink 16 of the present invention may be used with any existing heat sink having a plurality of spaced fins for dissipating heat.

Figure 3:
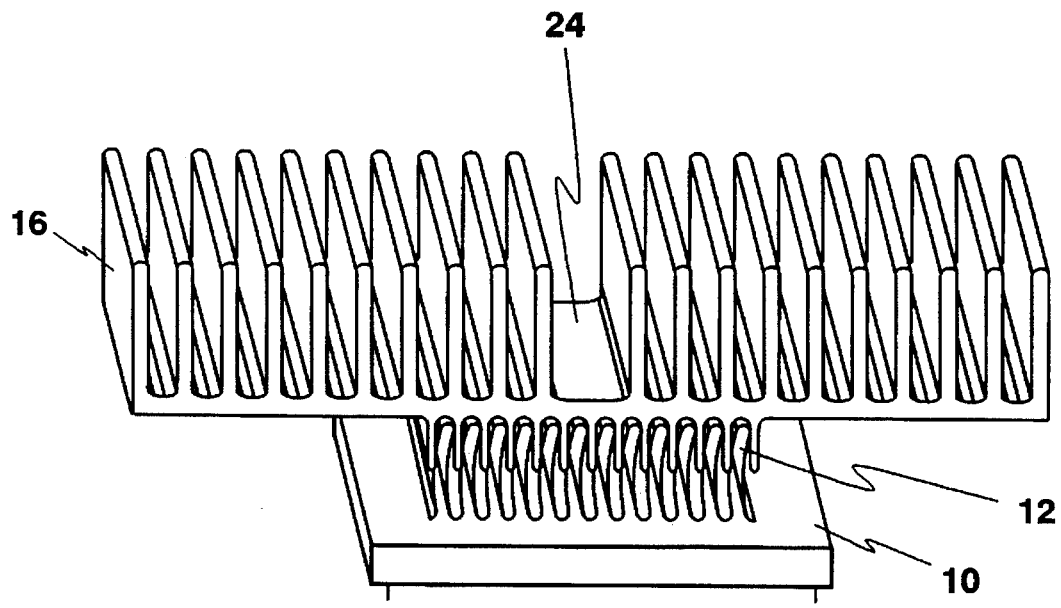
FIG. 3 illustrates the attachment of the add-on heat sink of FIG. 1 to the existing heat sink of FIG. 2 in accordance with the present invention.

FIG. 3 illustrates the attachment of the add-on heat sink 16 of the present invention to the existing heat sink 12 of FIG. 2. As shown, the second plurality of fins 22 extending downwardly from the support base 18 of the add-on heat sink 16 have been pushed down into the spacings between successive fins 14 of the existing heat sink 12. The second plurality of fins 22 of the add-on heat sink 16 intermesh with, and form an interference fit with, the fins 14 of the existing heat sink 12. This keeps the add-on heat sink 16 in place on the existing heat sink 12. Additionally, intermeshing of the fins 22 of the add-on heat sink 16 with the fins 14 of the existing heat sink provides an increased area of contact that improves the conduction of heat between the add-on and existing heat sinks. A good thermal interface is therefore achieved without the need for additional thermal interface material. Preferably, the surface area defined by the first plurality of fins 20 of the add-on heat sink is larger than the surface area defined by the plurality of fins 14 on the existing heat sink 12, such that the add-on heat sink 16 increases the dissipation of heat from the integrated circuit 10.

As mentioned above, while the add-on heat sink 16 may be used with any existing heat sink having a plurality of upstanding fins, the add-on heat sink 16 is particularly well suited for use with existing heat sinks of the type shown in FIGS. 2 and 3, wherein the heat sink 12 comprises a corrugated structure having individual folds that define the fins 14 of the heat sink. The corrugated structure imparts a degree of flexibility, or spring, to the individual fins 14 of the existing heat sink 12 that ensures a better interference fit with the second plurality of fins 22 on the add-on heat sink 16 of the present invention.

Figure 4A:
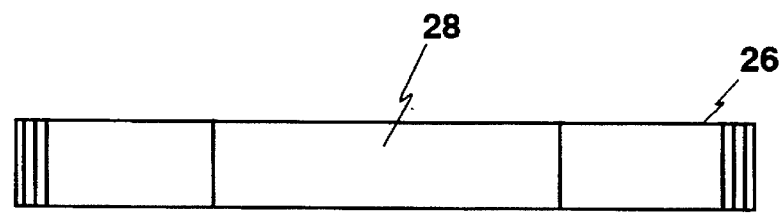
FIGS. 4a and 4b show an exemplary heat sink mounting clip.
Figure 4B:
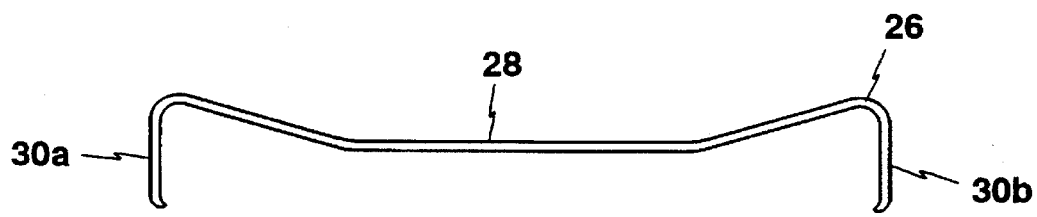

Referring again to FIG. 1, according to another aspect of the present invention, the add-on heat sink 16 has an enlarged spacing 24 between a selected pair of adjacent fins 20 on the upper surface 18a of the support member 18 to accommodate a conventional heat sink mounting clip. FIGS. 4a and 4b illustrate an exemplary heat sink mounting clip 26 for which the spacing 24 on the add-on heat sink 16 is intended. As best shown in FIG. 4b, the mounting clip 26 has an elongate, securing member 28 that would extend through the spacing 24 on the add-on heat sink 16. Two downward projections 30a and 30b, formed at opposite ends of the securing member 28, are designed to latch the respective sides of an integrated circuit chip, e.g. chip 10 of FIG. 2, to which the add-on heat sink is to be attached. This further secures the add-on heat sink 16 to the chip. The mounting clip 26 can be used in environments that are susceptible to significant vibration.

As the foregoing illustrates, the present invention is directed to an add-on heat sink that provides a means for upgrading the heat dissipation capabilities of an existing heat sink. This allows circuit boards designed with such existing heat sinks to be upgraded for use in harsher thermal environments without the need for redesigning the circuit board. One circuit board design can therefore be used in several different thermal environments. This also allows customers to maintain a single source of spare circuit boards that can then be used in computers systems having different thermal characteristics. The add-on heat sink of the present invention is both easy to install, and easy to remove during servicing. It is understood that changes may be made to the embodiments described above without departing from the broad inventive concepts thereof. Accordingly, the present invention is not limited to the particular embodiments disclosed, but is intended to cover all modifications that are within the spirit and scope of the invention as defined by the appended claims.

What is claimed is:

1. A combination heat sink for increasing the heat dissipation capabilities of an existing heat sink affixed to an integrated circuit including an existing heat sink which comprises a plurality of spaced fins for dissipating heat and an add-on heat sink comprising:

a support base;

a first plurality of spaced fins placed in a lateral direction along the base extending upwardly from the upper surface of the support base for dissipating heat;

a second plurality of spaced fins extending downwardly from the lower surface of the support base in same said lateral direction, the second plurality of spaced fins being arranged to intermesh with the fins of the existing heat sink and to form an interference fit therewith, whereby the add-on heat sink can be removably attached to the existing heat sink; and said first plurality of spaced fins extends in said lateral direction to a greater extent than that of the said second plurality of spaced fins.

2. The add-on heat sink of claim 1 having an enlarged spacing on the upper surface of the support base between a selected pair of adjacent fins to accommodate a heat sink mounting clip for securing the add-on heat sink to the existing heat sink and integrated circuit chip.

3. The add-on heat sink of claim 1 wherein a surface area defined by the first plurality of fins of the add-on heat sink is larger than a surface area defined by the plurality of fins on the existing heat sink.

4. The add-on heat sink of claim 1 wherein the second plurality of fins form a heat conductive interface with the fins of the existing heat sink.

5. An add-on heat sink for increasing the heat dissipation capabilities of an existing heat sink affixed to an integrated circuit, wherein the existing heat sink comprises a plurality of spaced fins for dissipating heat, said add-on heat sink comprising:

a substantially planar support base;

a first plurality of spaced fins extending upwardly from an upper surface of the support base for dissipating heat, said first plurality of fins being spaced on said upper surface along a lateral direction of said support base; and a second plurality of spaced fins extending downwardly from a lower surface of the support base, the second plurality of fins being arranged to intermesh with the fins of the existing heat sink and to form an interference fit therewith when the add-on heat sink is pushed onto the existing heat sink, said second plurality of fins being spaced along the lower surface of said support base in the same lateral direction as said first plurality of fins on the upper surface of the support base, the extent of said first plurality of fins in said lateral direction being greater than the extent of the second plurality of fins in said lateral direction, whereby the add-on heat sink can be removably attached to the existing heat sink.

6. The add-on heat sink of claim 5 having an enlarged spacing on the upper surface of the support base between a selected pair of adjacent fins to accommodate a heat sink mounting clip for securing the add-on heat sink to the existing heat sink and integrated circuit chip.

7. The add-on heat sink of claim 5 wherein a surface area defined by the first plurality of fins of the add-on heat sink is larger than a surface area defined by the plurality of fins on the existing heat sink.

8. The add-on heat sink of claim 5 wherein the support base and first and second pluralities of fins are formed of a thermally conductive aluminum alloy.

9. The add-on heat sink of claim 5 wherein the support base and first and second pluralities of fins are integrally formed of a heat conductive material.

10. A combination comprising:

a first heat sink affixed to an integrated circuit and having a plurality of spaced fins for dissipating heat; and an add-on heat sink comprising:

a support base;

a first plurality of spaced fins extending from the support base for dissipating heat; and a second plurality of spaced fins extending from the support base, the second plurality of fins being arranged to intermesh with the fins of the existing heat sink and to form an interference fit therewith, whereby the add-on heat sink can be removably attached to the first heat sink.

11. The combination recited in claim 10 wherein the support base of the add-on heat sink is substantially planar.

12. The combination recited in claim 11 wherein the first plurality of spaced fins of the add-on heat sink extend upwardly from an upper surface of the support base thereof, and wherein the second plurality of spaced fins of the add-on heat sink extend downwardly from a lower surface of the support base to intermesh with the fins of the first heat sink when the add-on heat sink is pushed onto the first heat sink.

13. The add-on heat sink of claim 12 wherein the first and second pluralities of fins of the add-on heat sink are each spaced along the respective upper and lower surfaces of the support base in a same lateral direction along the support base, and wherein the extent of the first plurality of fins in said lateral direction is greater than the extent of the second plurality of fins in said lateral direction.

14. The combination recited in claim 12 wherein the add-on heat sink has an enlarged spacing on the upper surface of the support base between a selected pair of adjacent fins thereof to accommodate a heat sink mounting clip for securing the add-on heat sink to the first heat sink.

15. The combination recited in claim 10 wherein a surface area defined by the first plurality of fins of the add-on heat sink is larger than a surface area defined by the plurality of fins on the first heat sink.

16. The combination recited in claim 10 wherein the support base and first and second pluralities of fins of the add-on heat sink are formed of a thermally conductive aluminum alloy.

17. The combination recited in claim 10 wherein the support base and first and second pluralities of fins of the add-on heat sink are integrally formed of a heat conductive material.

\* \* \* \* \*